(12) United States Patent
Wood et al.

(10) Patent No.: US 8,788,225 B2
(45) Date of Patent: Jul. 22, 2014

(54) CELL DIAGNOSTIC SYSTEM AND METHOD

(75) Inventors: Steven J. Wood, Shorewood, WI (US); Emmanuel Maubert, Pontoise (FR); Olivier Veglio, Poissy (FR)

(73) Assignee: Johnson Controls-Saft Advanced Power Solutions LLC, Wilmington, DE (US)

( * ) Notice: Subject to any disclaimer, the term of this patent is extended or adjusted under 35 U.S.C. 154(b) by 555 days.

(21) Appl. No.: 12/999,587

(22) PCT Filed: Jun. 24, 2009

(86) PCT No.: PCT/US2009/048362
§ 371 (c)(1),
(2), (4) Date: Dec. 16, 2010

(87) PCT Pub. No.: WO2009/158367
PCT Pub. Date: Dec. 30, 2009

(65) Prior Publication Data
US 2011/0172940 A1 Jul. 14, 2011

Related U.S. Application Data

(60) Provisional application No. 61/076,547, filed on Jun. 27, 2008.

(51) Int. Cl.
*G01R 31/36* (2006.01)
*H02J 7/00* (2006.01)
(52) U.S. Cl.
USPC .......................................... 702/63; 320/136
(58) Field of Classification Search
USPC ............... 702/63, 57–60, 64–65, 81, 84, 127, 702/182–183, 185, 189; 324/76.11, 324/76.65–76.67, 76.76, 426, 434, 500, 324/512, 519, 522, 548–549, 600, 606; 320/112, 116, 120–121, 127, 132, 320/134–136, 166; 322/22–25, 27; 429/90–93, 99, 149, 152, 428–432, 429/452
See application file for complete search history.

(56) References Cited

U.S. PATENT DOCUMENTS 6,208,114 B1 3/2001 Jones et al.
6,960,899 B2 11/2005 Kobayashi et al.
(Continued)

FOREIGN PATENT DOCUMENTS

CN 1877345 12/2006
EP 1936777 6/2008
(Continued)

OTHER PUBLICATIONS

JP 2001-296341 (English version), 2001, 5 pp.*
(Continued)

*Primary Examiner* — Toan Le
(74) *Attorney, Agent, or Firm* — Foley & Lardner LLP (57) ABSTRACT

A system for assessing the accuracy of an electrochemical cell voltage measurement includes a cell discharge circuit electrically coupled to at least one electrochemical cell and configured to partially discharge the at least one cell when the cell discharge circuit is activated, and a cell measurement circuit electrically coupled to the at least one cell and to the cell discharge circuit. The cell measurement circuit is configured to measure a voltage of the at least one cell before activation of the cell discharge circuit and after activation of the cell discharge circuit. The cell measurement circuit compares the voltage before activation of the cell discharge circuit to the voltage after activation of the cell discharge circuit to detect if an error in the voltage measurement occurred.

20 Claims, 7 Drawing Sheets

(56) References Cited

U.S. PATENT DOCUMENTS

| | | |
|---|---|---|
| 2003/0178970 A1 | 9/2003 | Minamiura et al. |
| 2004/0001996 A1 | 1/2004 | Sugimoto |
| 2004/0155629 A1 | 8/2004 | Kobayashi et al. |
| 2006/0103351 A1* | 5/2006 | Tanigawa et al. ............. 320/118 |
| 2008/0143298 A1* | 6/2008 | Yoshida ........................ 320/136 |

FOREIGN PATENT DOCUMENTS

| | | |
|---|---|---|
| JP | 2001296341 A * | 10/2001 |
| JP | 2002168928 | 6/2002 |

OTHER PUBLICATIONS

JP 2001-296341 (Abstract—English version), 2001, 2 pp.*
International Search Report and Written Opinion for PCT/US2009/048362, mail date Jan. 4, 2010, 8 pages.
First Chinese Office Action mailed Dec. 5, 2012 in Application No. 2009/80129289.4 (5 pgs) Parent 069236-2102.
European Search Report regarding Application No. 09770900.0 dated Jun. 11, 2013 (6 pages).

* cited by examiner

CELL DIAGNOSTIC SYSTEM AND METHOD

CROSS-REFERENCE TO RELATED PATENT APPLICATIONS

The present application claims priority to and the benefit of U.S. Provisional Patent Application 61/076,547, filed Jun. 27, 2008, the entire disclosure of which is incorporated herein by reference.

BACKGROUND

The present application relates generally to the field of batteries and battery systems. More specifically, the present application relates to batteries and battery systems that may be used in vehicle applications to provide at least a portion of the motive power for the vehicle.

Vehicles using electric power for all or a portion of their motive power (e.g., electric vehicles (EVs), hybrid electric vehicles (HEVs), plug-in hybrid electric vehicles (PHEVs), and the like, collectively referred to as "electric vehicles") may provide a number of advantages as compared to more traditional gas-powered vehicles using internal combustion engines. For example, electric vehicles may produce fewer undesirable emission products and may exhibit greater fuel efficiency as compared to vehicles using internal combustion engines (and, in some cases, such vehicles may eliminate the use of gasoline entirely, as is the case of certain types of PHEVs).

As electric vehicle technology continues to evolve, there is a need to provide improved power sources (e.g., battery systems or modules) for such vehicles. For example, it is desirable to increase the distance that such vehicles may travel without the need to recharge the batteries. It is also desirable to improve the performance of such batteries and to reduce the cost associated with the battery systems.

One area of improvement that continues to develop is in the area of battery chemistry. Early electric vehicle systems employed nickel-metal-hydride (NiMH) batteries as a propulsion source. Over time, different additives and modifications have improved the performance, reliability, and utility of NiMH batteries.

More recently, manufacturers have begun to develop lithium-ion batteries that may be used in electric vehicles. There are several advantages associated with using lithium-ion batteries for vehicle applications. For example, lithium-ion batteries have a higher charge density and specific power than NiMH batteries. Stated another way, lithium-ion batteries may be smaller than NiMH batteries while storing the same amount of charge, which may allow for weight and space savings in the electric vehicle (or, alternatively, this feature may allow manufacturers to provide a greater amount of power for the vehicle without increasing the weight of the vehicle or the space taken up by the battery system).

It is generally known that lithium-ion batteries perform differently than NiMH batteries and may present design and engineering challenges that differ from those presented with NiMH battery technology. For example, lithium-ion batteries may be more susceptible to variations in battery temperature than comparable NiMH batteries, and thus systems may be used to regulate the temperatures of the lithium-ion batteries during vehicle operation. The manufacture of lithium-ion batteries also presents challenges unique to this battery chemistry, and new methods and systems are being developed to address such challenges.

Lithium-ion batteries may be sensitive to overcharge or overdischarge. If a lithium-ion battery is overcharged or overdischarged, the battery may become irreversibly damaged or fail. As a protection against such an occurrence, lithium-ion batteries may include voltage monitoring circuits to monitor the voltage of each cell in the battery. Additional circuitry or a microcontroller may monitor the voltage level of each cell and disconnect the cell if an under voltage or over voltage condition occurs.

It would be desirable to provide an improved battery module and/or system for use in electric vehicles that addresses one or more challenges associated with NiMH and/or lithium-ion battery systems used in such vehicles. It also would be desirable to provide a battery module and/or system that includes any one or more of the advantageous features that will be apparent from a review of the present disclosure.

SUMMARY

According to an exemplary embodiment, a system for assessing the accuracy of an electrochemical cell voltage measurement includes a cell discharge circuit electrically coupled to at least one electrochemical cell and configured to partially discharge the at least one cell when the cell discharge circuit is activated, and a cell measurement circuit electrically coupled to the at least one cell and to the cell discharge circuit. The cell measurement circuit is configured to measure a voltage of the at least one cell before activation of the cell discharge circuit and after activation of the cell discharge circuit. The cell measurement circuit compares the voltage before activation of the cell discharge circuit to the voltage after activation of the cell discharge circuit to detect if an error in the voltage measurement occurred.

According to another exemplary embodiment, a method for assessing the accuracy of an electrochemical cell voltage measurement includes measuring a first voltage of at least one electrochemical cell using a cell measurement circuit electrically coupled to the at least one cell and activating a cell discharge circuit electrically coupled to the at least one cell to at least partially discharge the at least one cell. The method also includes measuring a second voltage of the at least one cell after activation of the cell discharge circuit and comparing the first voltage to the second voltage to determine if there is an error in the voltage measurement of the at least one cell.

According to another exemplary embodiment, a method for assessing the accuracy of an electrochemical cell voltage measurement includes providing a cell measurement circuit electrically coupled to at least one electrochemical cell, and providing a cell discharge circuit electrically coupled to the at least one cell and configured to partially discharge the at least one cell when activated. The method includes measuring a first voltage of the at least one cell using the cell measurement circuit, activating the cell discharge circuit to partially discharge the at least one cell, measuring a second voltage of the cell after activation of the cell discharge circuit, and comparing the first voltage to the second voltage to determine if there is an error in the voltage measurement of the at least one cell.

DETAILED DESCRIPTION

Figure 1:
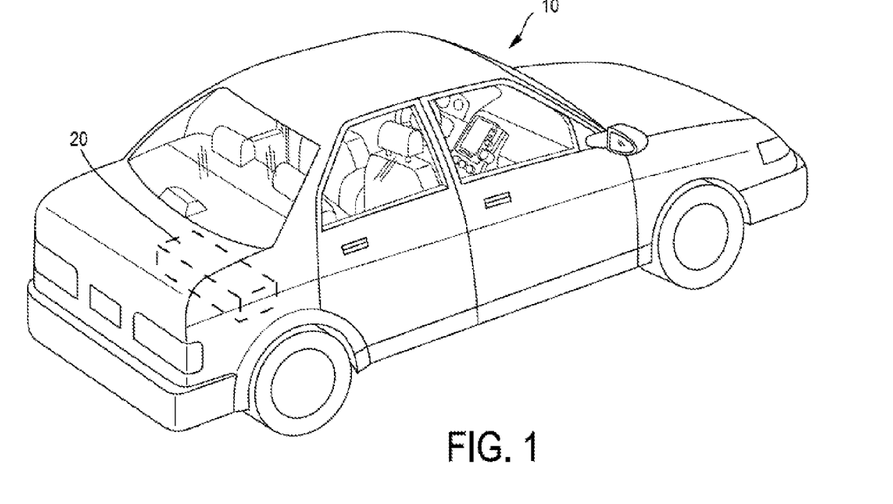
FIG. 1 is a perspective view of a vehicle including a battery system according to an exemplary embodiment.

FIG. 1 is a perspective view of a vehicle 10 in the form of an automobile (e.g., a car) having a battery system 20 for providing all or a portion of the motive power for the vehicle 10. Such a vehicle 10 can be an electric vehicle (EV), a hybrid electric vehicle (HEV), a plug-in hybrid electric vehicle (PHEV), or other type of vehicle using electric power for propulsion (collectively referred to as "electric vehicles").

Although the vehicle 10 is illustrated as a car in FIG. 1, the type of vehicle may differ according to other exemplary embodiments, all of which are intended to fall within the scope of the present disclosure. For example, the vehicle 10 may be a truck, bus, industrial vehicle, motorcycle, recreational vehicle, boat, or any other type of vehicle that may benefit from the use of electric power for all or a portion of its propulsion power.

Although the battery system 20 is illustrated in FIG. 1 as being positioned in the trunk or rear of the vehicle, according to other exemplary embodiments, the location of the battery system 20 may differ. For example, the position of the battery system 20 may be selected based on the available space within a vehicle, the desired weight balance of the vehicle, the location of other components used with the battery system 20 (e.g., battery management systems, vents or cooling devices, etc.), and a variety of other considerations.

Figure 2:
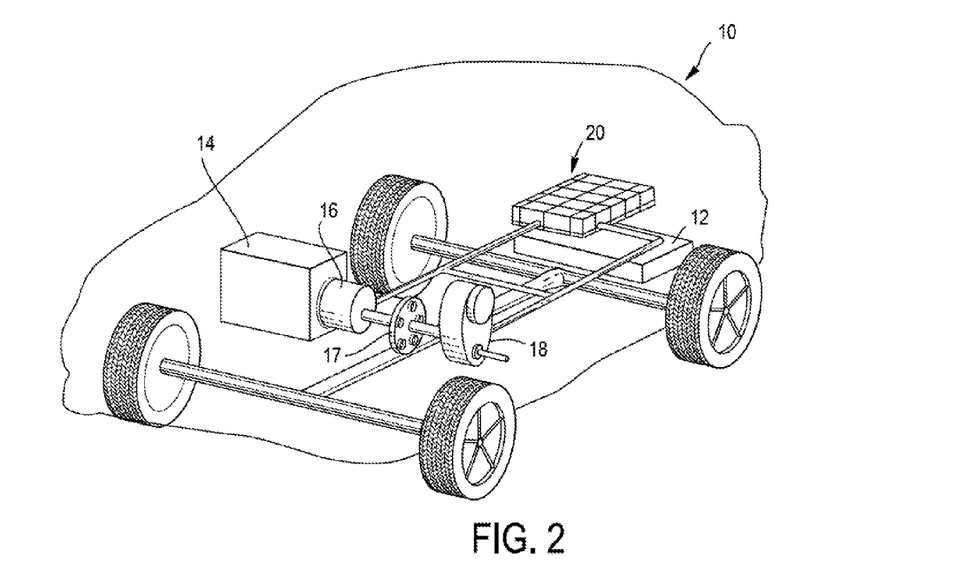
FIG. 2 is a perspective cutaway schematic view of a vehicle provided in the form of a hybrid electric vehicle (HEV) according to an exemplary embodiment.

FIG. 2 illustrates a cutaway schematic view of a vehicle 10 provided in the form of an HEV according to an exemplary embodiment. A battery system 20 is provided toward the rear of the vehicle 10 proximate a fuel tank 12 (the battery system 20 may be provided immediately adjacent the fuel tank 12 or may be provided in a separate compartment in the rear of the vehicle 10 (e.g., a trunk) or may be provided elsewhere in the vehicle 10). An internal combustion engine 14 is provided for times when the vehicle 10 utilizes gasoline power to propel the vehicle 10. An electric motor 16, a power split device 17, and a generator 18 are also provided as part of the vehicle drive system. Such a vehicle 10 may be powered or driven by just the battery system 20, by just the engine 14, or by both the battery system 20 and the engine 14. It should be noted that other types of vehicles and configurations for the vehicle electrical system may be used according to other exemplary embodiments, and that the schematic illustration of FIG. 2 should not be considered to limit the scope of the subject matter described in the present application.

According to various exemplary embodiments, the size, shape, and location of the battery system 20, the type of vehicle 10, the type of vehicle technology (e.g., EV, HEV, PHEV, etc.), and the battery chemistry, among other features, may differ from those shown or described.

Figure 3:
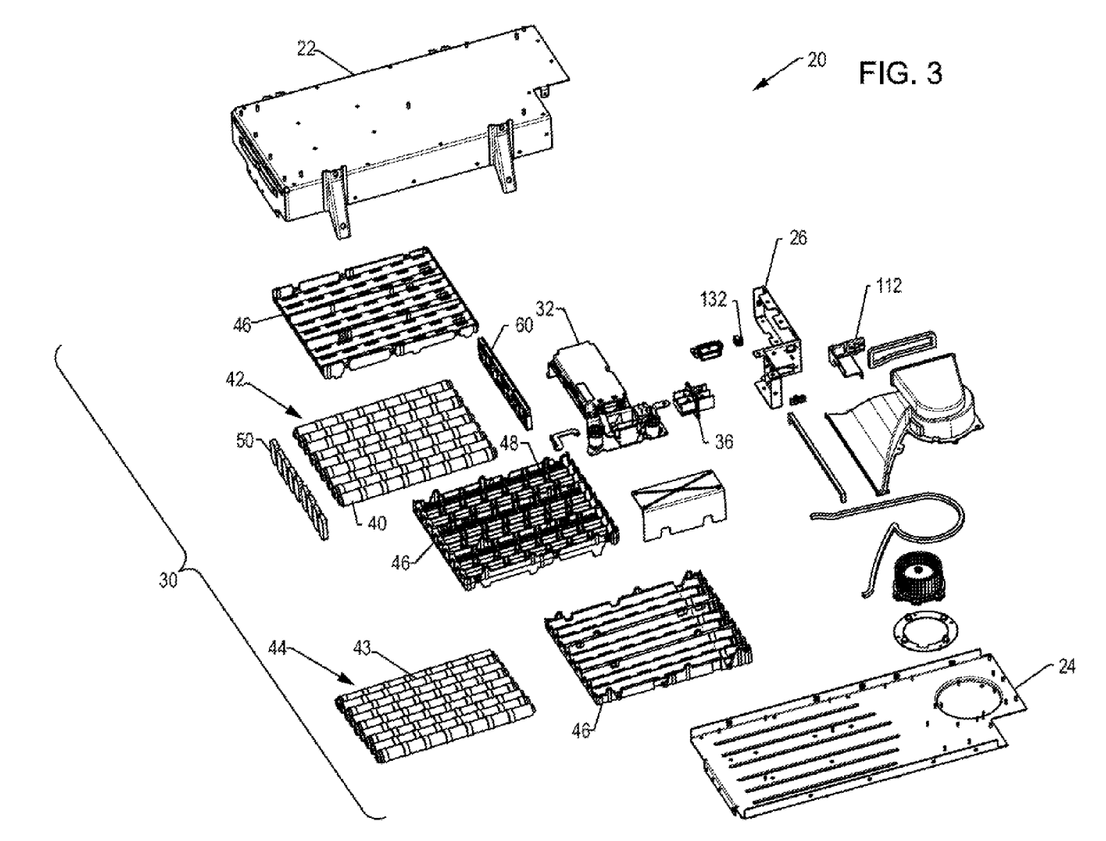
FIG. 3 is an exploded perspective view of a battery system according to an exemplary embodiment.

Referring to FIG. 3, an exploded view of a battery system 20 is shown according to an exemplary embodiment. The battery system 20 includes a plurality of electrochemical cells or batteries 40 (e.g., lithium-ion cells, nickel-metal-hydride cells, lithium polymer cells, etc., or other types of electrochemical cells now known or hereafter developed). According to an exemplary embodiment, the electrochemical cells 40 are generally cylindrical nickel-metal-hydride cells configured to store an electrical charge. According to other exemplary embodiments, the cells 40 could have other physical configurations (e.g., oval, prismatic, polygonal, etc.). The capacity, size, design, and other features of the cells 40 may also differ from those shown according to other exemplary embodiments.

The components of the battery system 20 are contained in an insulative enclosure or container, shown in FIG. 3 as being formed by a cover 22, a base plate 24, and an end cap 26. The cover 22, base plate 24, and end cap 26 are formed from a polymer or other non-conductive material and may be coupled together with a variety of mechanisms including threaded fasteners, integrally formed latches or snaps, pins, etc. As described in greater detail below, disconnect functionality for the battery system 20 may be built into the cover 22, base plate 24, and/or end cap 26.

According to an exemplary embodiment, the battery system 20 includes a battery module 30 that packages or contains the electrochemical cells 40, connects the electrochemical cells 40 to each other and/or to other components of the vehicle electrical system, and regulates the electrochemical cells 40 and other features of the battery system 20. The battery system 20 may include features that are responsible for monitoring and controlling the electrical performance of the system, managing the thermal behavior of the system, containment and/or routing of effluent (e.g., gases that may be vented from a cell), and other aspects of the battery system 20.

While FIG. 3 shows an exemplary embodiment of a battery system 20, it should be understood that the battery system 20 is not limited to any particular arrangement, as will be appreciated by those reviewing this disclosure. For instance, while the battery system 20 shown in FIG. 3 is shown with horizontally oriented cells 40 arranged in rows or sticks in two layers or groups by parallel frame members, it should be understood that the battery module 30 may have many different configurations. For example, the cells 40 may also be generally vertical, be several separate groups, or arranged in other configurations. Furthermore, different numbers and types (e.g., nickel-metal-hydride, etc.) of cells 40 may be used.

Each of the cells 40 are electrically coupled or conductively connected to one or more other cells 40 or other components of the battery system 20 using connectors provided in the form of bus bars or similar elements. According to an exemplary embodiment, each of the cells 40 are electrically coupled or conductively connected to a voltage monitoring/measuring system or circuit that is configured to monitor/measure the voltage of each individual cell 40 within the battery system 20.

Referring generally to FIGS. 4-8, one challenge associated with battery systems including a number of cells is the ability to detect that the voltage monitoring circuits of the battery system 20 are working properly. Under some circumstances, when the system or circuit measuring the voltage of one or more cells fails, the measurement system may be unable to detect the failure because a floating voltage from other components of the system (e.g., discharge capacitors, discharge circuitry, other circuitry etc.) gives the impression that the cell voltage measurement system is still operating properly. Although the voltage monitoring circuit has failed, the floating voltage relating to the remaining components of the voltage monitoring circuit may provide incorrect voltage information to the controlling device, potentially allowing the voltage of the cells 40 of the battery system 20 to exceed predetermined acceptable upper or lower limits of operation. Additional circuitry and/or methods may be used to determine if the measurement system is operational and validate the measured values of the voltage for each cell 40.

An accurate measurement of the voltage of each cell 40 may be obtained by including additional circuitry and/or logic in the measurement and control system of a battery system 20. A cell discharge circuit may be added for each cell 40, and a cell control system may activate the cell discharge circuit at select times or specific intervals (e.g., at each power on or reset of the cell supervisory controller). In the case of a failed voltage measurement circuit (e.g., due to a break inside a spring contact, a break in a voltage measurement lead wire, etc.), voltage measurements taken before and after activation of the cell discharge circuit may identify the existence of a floating voltage (e.g., caused by input leakage from the microcontroller and external resistor/capacitor filters) and thus may help to identify a failed voltage measurement circuit. The voltage measurement system may then treat the voltage of the cell 40 as zero voltage rather than the value of the false floating voltage.

The system operates by measuring the voltage of the individual cells 40 both before and after activating the discharge circuit. According to an exemplary embodiment, the voltage measurement system first measures each cell 40 in a first set of cells and then each cell 40 in a second set of cells. According to an exemplary embodiment, the voltage measurement system first measures each odd cell 40 and then each even cell 40. According to other exemplary embodiments, the voltage measurement system may measure the voltage of cells 40 in a different order (e.g., the system may measure each even cell first and then each odd cell). According to another exemplary embodiment, the voltage measurement system measures cells 40 that are adjacent to one another. According to other exemplary embodiments, the voltage measurement system may measure the cells 40 that are not adjacent to one another.

Upon detecting a reading of a cell 40 having zero voltage movement (i.e., the voltage reading before activation of the cell discharge circuit is equal to the voltage reading after activating the cell discharge circuit), and thus a failed voltage measurement circuit, the cell supervisory controller may take appropriate action. For example, the cell supervisory controller may discontinue battery charging, disable the battery, generate diagnostic messages for higher level systems, etc.

Figure 4A:
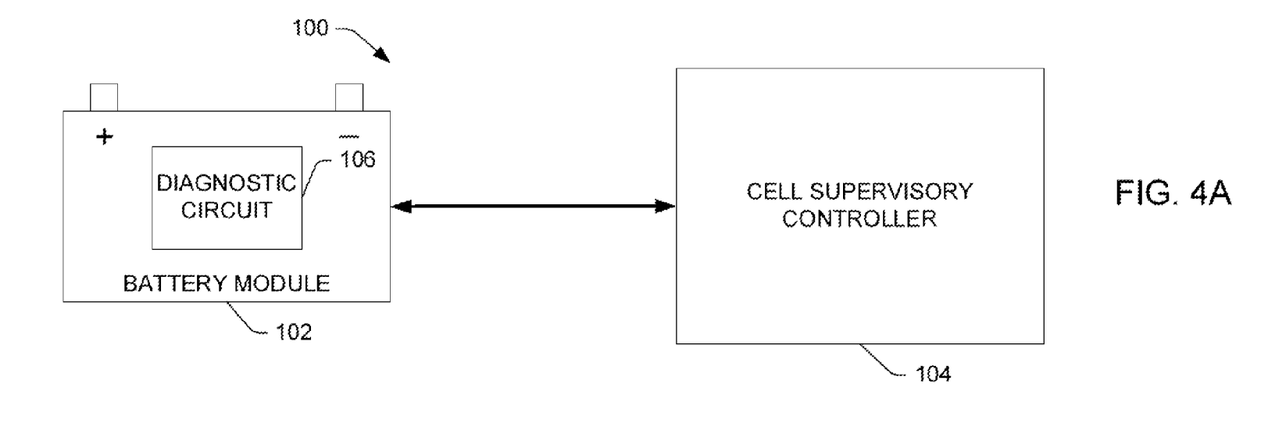
FIG. 4A is a block diagram of a system for detecting a failure of one or more cell voltage sensing circuits, where the cell supervisory controller is located remotely from the battery module according to an exemplary embodiment.

Referring now to FIG. 4A, a battery system 100 is configured to facilitate accurate and reliable measurement of a cell voltage according to an exemplary embodiment. Battery system 100 includes a battery module 102 that includes a diagnostic circuit 106 (e.g., an open cell line diagnostic, a shorted cell line diagnostic, etc.). Diagnostic circuit 106 is communicatively coupled (e.g., by a wire, bus, wireless connection, etc.) to a remote cell supervisory controller 104 that is external the battery module 102 (e.g., the cell supervisory controller 104 may be included within the battery system 100, may be included within the vehicle 10). According to an exemplary embodiment, the cell supervisory controller 104 is part of the battery system 100 and included within the battery management system.

Diagnostic circuit 106 is configured to determine if the cell voltage measurement system is operating properly and communicating a valid voltage measurement for each cell to the cell supervisory controller 104. For example, diagnostic circuit 106 may provide an indication of the voltage of each cell or an indication of zero volts for any cell where the voltage measurement system has failed or is working improperly. One failure mode of battery system 100 is a break in a measurement circuit resulting in a floating voltage that is incorrect and yet in a valid range and thus indistinguishable from an actual voltage of a cell.

According to an exemplary embodiment, cell supervisory controller 104 determines what action the other components of the electrical system should take with regards to battery module 102 upon receiving the individual cell voltages. For example, for a lithium-ion cell, the cell voltage level may not be allowed to drop below a defined minimum level in order to avoid irreparable damage to battery module 102. Conversely, overcharging battery module 102 can result in damage to battery module 102 and other components of the electrical system. Accordingly, cell supervisory controller 104 should receive accurate and reliable information regarding the current cell voltage levels before allowing other systems of vehicle 10 to use the power stored in battery module 102 or allowing battery module 102 to be charged.

Figure 4B:
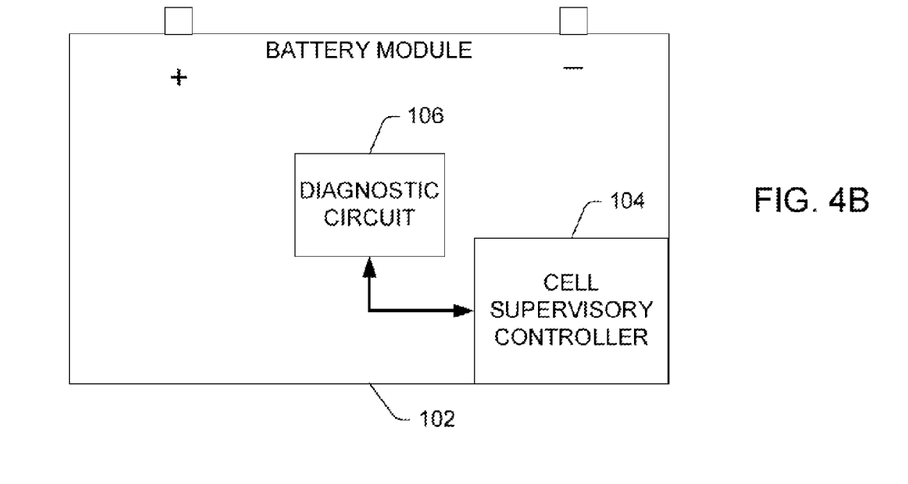
FIG. 4B is a block diagram of a system for detecting a failure of one or more cell voltage sensing circuits, where the cell supervisory controller is located internal to the battery module according to an exemplary embodiment.

Referring to FIG. 4B, according to another exemplary embodiment, cell supervisory controller 104 may be included inside battery module 102 so the battery module 102 can operate in a self-contained manner with regard to protection against under voltage and over voltage incidents. This self-containment may reduce risks of incompatibility between the diagnostic circuit 106 circuitry and cell supervisory controller 104.

Figure 5:
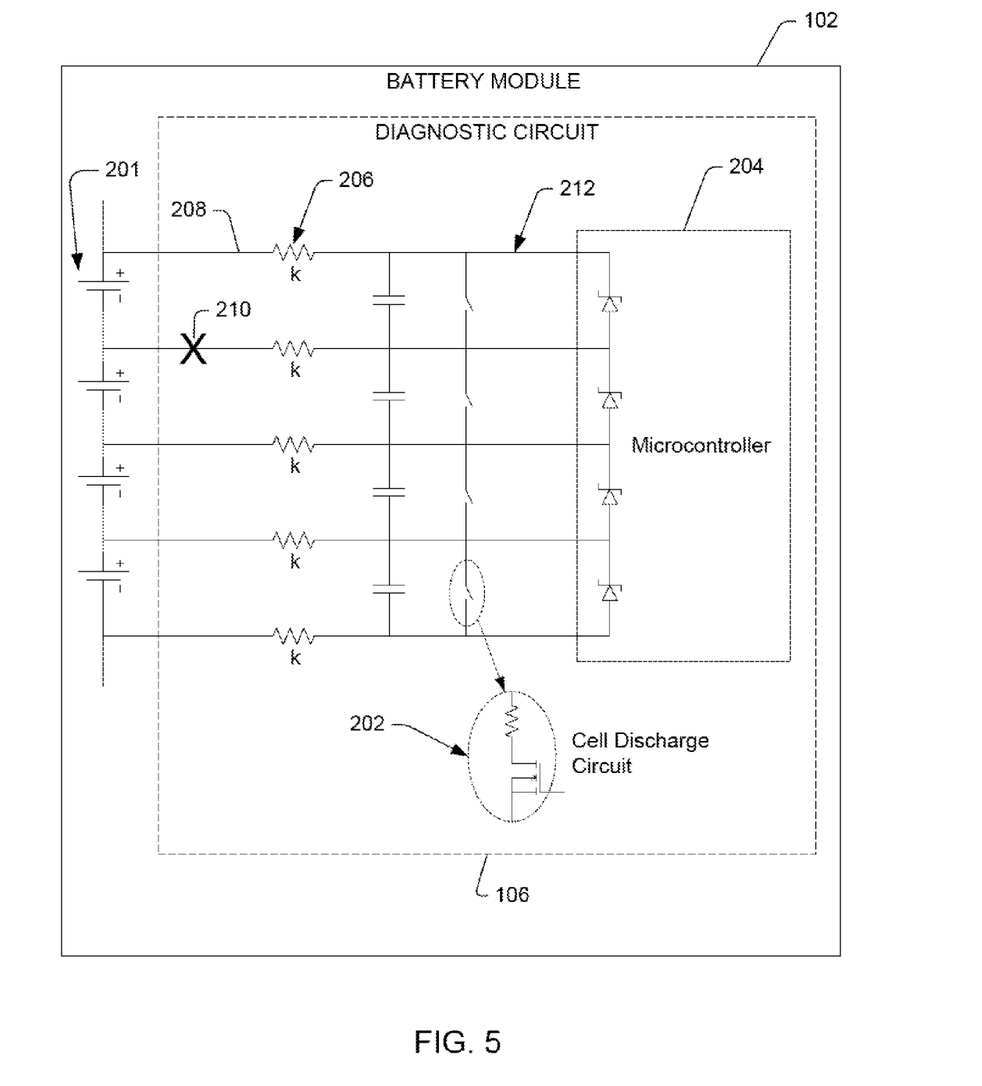
FIG. 5 is a block diagram illustrating greater detail of a diagnostic circuit for cells of a battery module including a microcontroller and a cell discharge circuit according to an exemplary embodiment.

Referring now to FIG. 5, diagnostic circuit 106 includes a cell discharge circuit 202, a microcontroller 204, and a cell measurement or monitoring circuit 206. Each cell discharge circuit 202 is electrically coupled to a cell 201 of battery module 102 and is configured to balance the voltages of cells 201 so that each of cells 201 have substantially the same charge as compared to the other cells 201. Each cell measurement circuit 206 is electrically coupled to a corresponding cell 201 and to a corresponding cell discharge circuit 202 and is configured to monitor the voltage of cell 201 to diagnose whether it is functioning properly or not.

Cell discharge circuit 202 may be activated by microcontroller 204 to determine if voltage measuring circuit 206 was compromised or damaged at a voltage sense line 208, for example, by a break 210 inside a contact (e.g., a spring contact). Such a break may cause a floating voltage 212 on the sense line 208. According to other exemplary embodiments, break 210 may be a failed resistor, a bad solder connection, or any other open or short circuit. After cell discharge circuit 202 is activated, the voltage of cell 201 is measured and compared to the voltage before activation of cell discharge unit 202. If there is no difference in voltage measurements (i.e., no cell discharging occurred), voltage sense line 208 and/or measuring circuit 206 may be broken or damaged. Since the actual voltage of the corresponding cell 201 is unknown (i.e., only the floating voltage is being measured), the voltage of the corresponding cell 201 may be treated as zero volts, even if the actual voltage of cell 201 is not actually equal to zero volts.

Microcontroller 204 monitors each cell voltage and provides a signal representative of the measured voltages of cell 201 to cell supervisory controller 104. According to one exemplary embodiment, microcontroller 204 may be an AD7280 microcontroller available from Analog Devices, Inc. However, other exemplary embodiments are not limited to the use of this particular microcontroller and any microcontroller capable of monitoring cell voltage may be used. Microcontroller 204 may activate discharge circuit 202 for each cell 201 in turn. Microcontroller 204 may read or measure the cell voltage both before and after activation of cell discharge circuit 202. Microcontroller 204 may provide an indication of the voltage and/or voltage movement related to the discharge of cell 201 to cell supervisory controller 104 for further analysis, for example, by higher level systems such as a battery management system. Microcontroller 204 may then repeat operation for each cell 201 of battery module 102.

According to various exemplary embodiments, each cell measurement circuit 206 may include a filtering resistor. According to one such exemplary embodiment, the filtering resistor may have a resistance value of about ten thousand (10,000) ohms. However, according to other exemplary embodiments, other resistance values may be used depending on the application.

Figure 6:
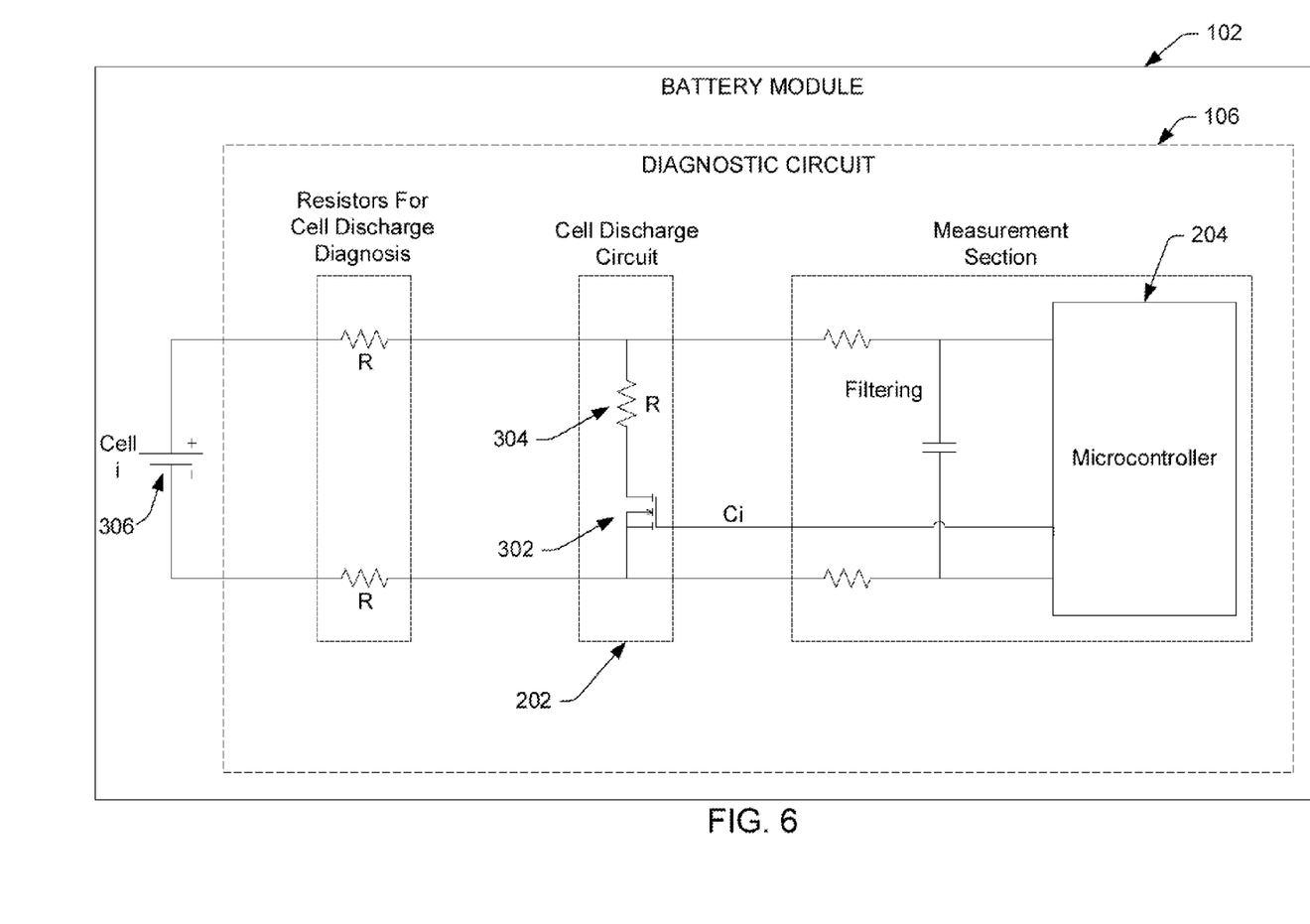
FIG. 6 is a schematic diagram illustrating a cell measurement control section and a cell discharge circuit in greater detail according to an exemplary embodiment.

Referring now to FIG. 6, a detailed schematic of cell discharge circuit 202 is illustrated, and includes a balancing resistor 304, a switch 302 (e.g., a transistor switch), and a control section including microcontroller 204, according to an exemplary embodiment. According to one exemplary embodiment, microcontroller 204 activates cell discharge circuit 202 by closing switch 302 to complete the circuit for an individual cell 306. Balancing resistor 304 may at least partially discharge cell 306 to minimize any voltage imbalance between adjacent cells. However, if voltage measuring circuit 206 is damaged, discharge circuit 202 will have no affect on cell 306 (i.e., will not discharge cell 306). In this case, the voltage being measured (i.e., the floating voltage 212) will be the same both before and after activation of the discharge circuit 202, resulting in a zero voltage movement measurement.

Upon receiving a zero voltage movement measurement, microcontroller 204 may indicate zero volts for the individual cell 306 (even if there is a floating voltage 212 being measured). According to one exemplary embodiment, balancing resistor 304 may have a resistance of about thirty-three (33) ohms. However, according to other exemplary embodiments, resistor 304 may have other resistance values depending on the application. After completing the measurement, microcontroller 204 can deactivate switch 302 and continue with the analysis of the next cell 306.

According to another exemplary embodiment, microcontroller 204 receives information related to the voltage level of each cell 306 and communicates this information to a battery management system for processing. If microcontroller 204 receives a signal indicating that cell 306 has an unacceptably high or low voltage reading, a signal may then be sent (e.g., to the battery management system) to not charge or discharge cell 306 any further until battery module 102 is serviced to determine the cause of the high or low voltage condition.

Figure 7:
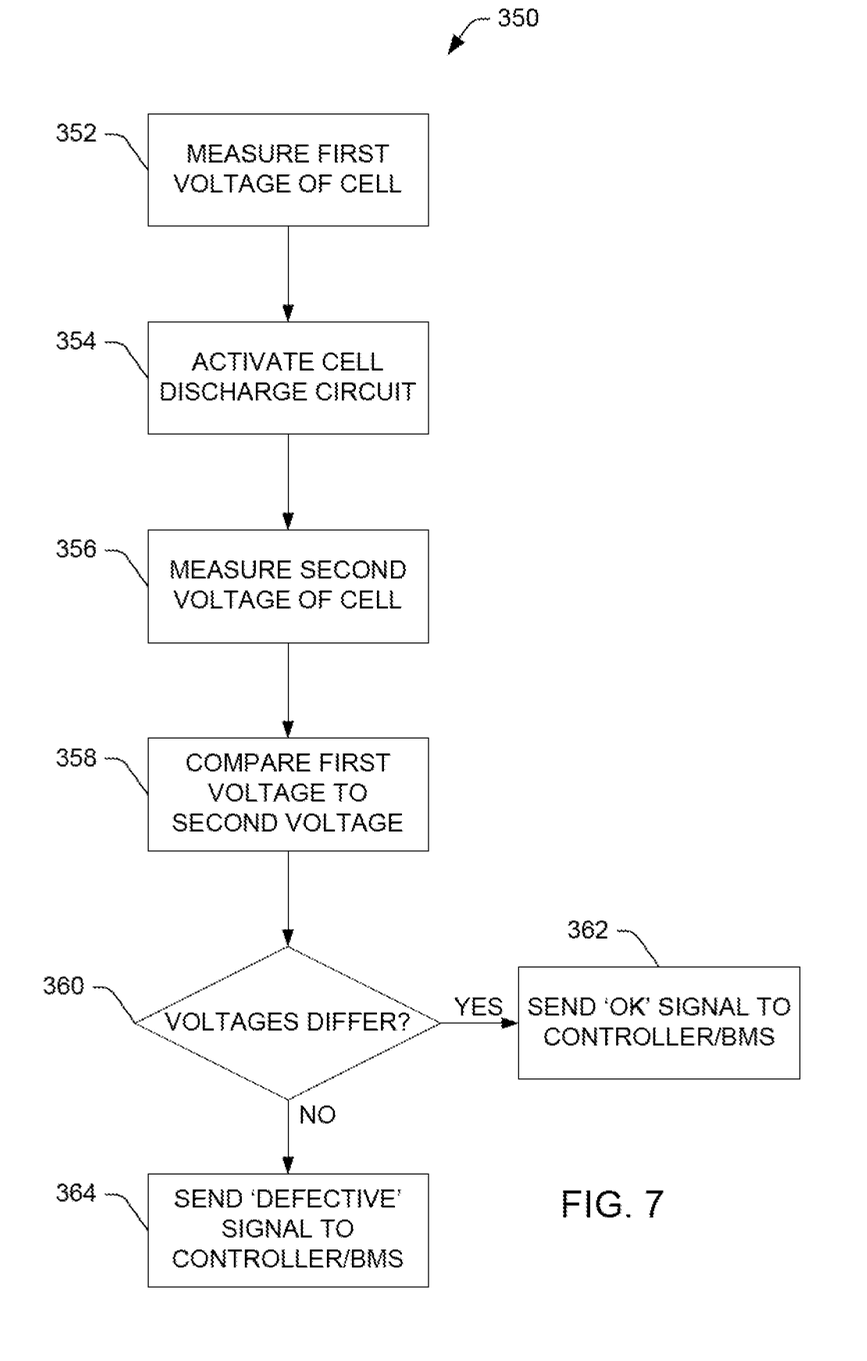
FIG. 7 is a flow diagram of a method for validating proper operation of a cell voltage measurement system for a cell according to an exemplary embodiment.

Referring to FIG. 7, a method 350 allows for monitoring of the voltage of individual cells 306 of battery module 102 and provides an indication of the results to cell supervisory controller 104 according to an exemplary embodiment. For each cell 306, microcontroller 204 measures a first or initial voltage of the cell 306 (step 352). Microcontroller 204 then activates cell discharge circuit 202 for cell 306 (step 354) and measures a second voltage of the cell 306 (step 356). Microcontroller 204 then compares the first and second voltages (step 358) and determines if the voltages differ from one another (step 360). If the voltages do differ, then sense line 308 and/or measurement circuit 306 may be functioning properly. Microcontroller 204 may provide a message or signal to cell supervisory controller 104 or the battery management system indicating proper functionality and/or microcontroller 204 may proceed to monitor the next cell 306 (step 362). If the voltages do not differ, then sense line 308 and/or measurement circuit 306 may be functioning improperly or may be defective. Microcontroller 204 may then provide a message or signal to cell supervisory controller 104 or the battery management system indicating a defect (step 364). Cell supervisory controller 204 or the battery management system may then take appropriate action, for example, discontinuing battery charging, disabling the battery, generating diagnostic messages for higher level systems, etc.

Figure 8:
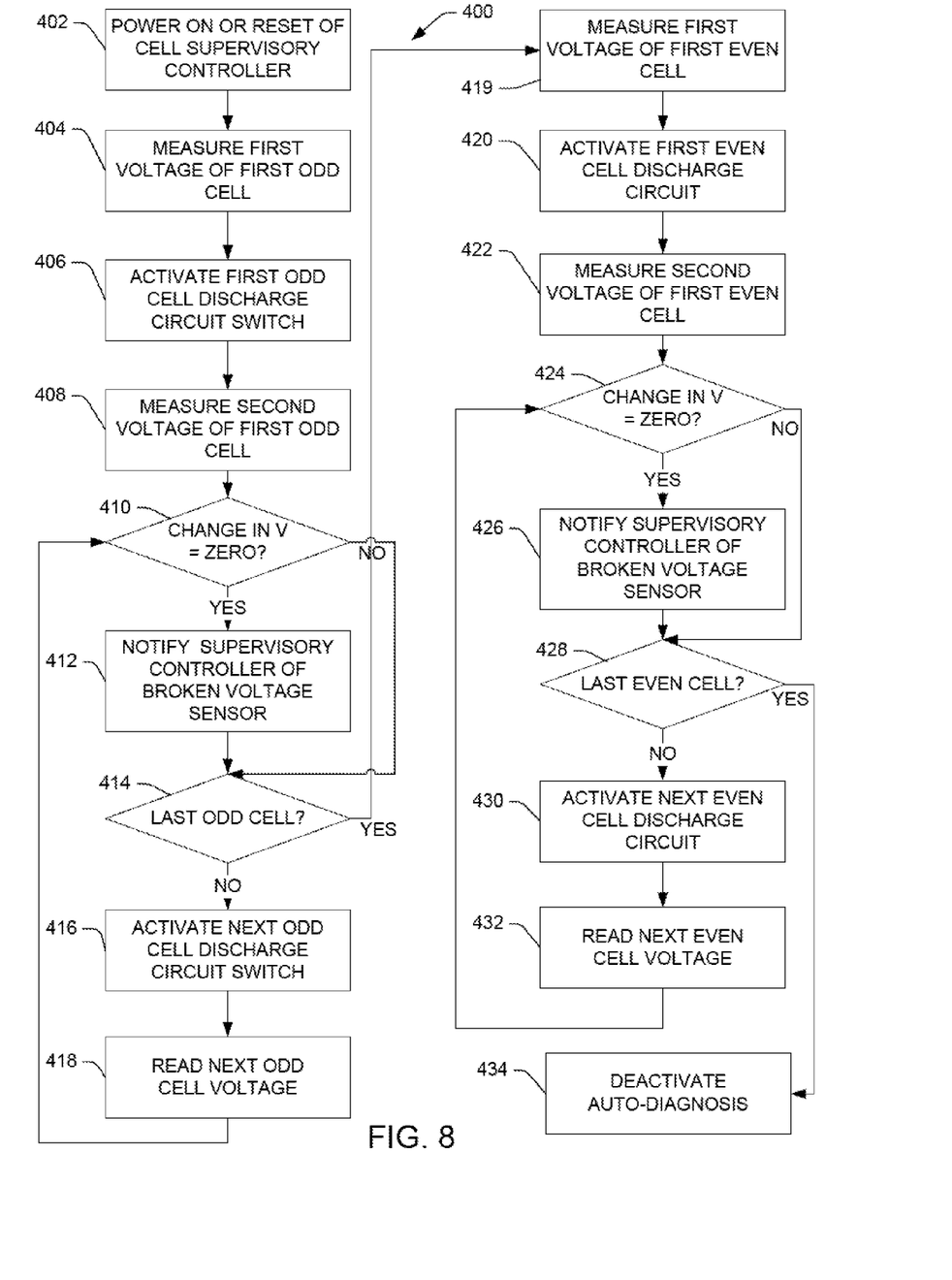
FIG. 8 is a block diagram of a method for validating proper operation of a cell voltage measurement system for a module or system according to another exemplary embodiment.

Referring to FIG. 8, a method 400 uses diagnostic circuit 106 to monitor the voltage of individual cells 306 of battery module 102 and to provide an indication of the results to cell supervisory controller 104, according to an exemplary embodiment. Each time the electrical system powers on or is reset (step 402), method 400 is executed by microcontroller 204 and an auto-diagnosis system (e.g., diagnostic circuit 106) is activated.

Microcontroller 204 measures a first voltage of a first odd numbered cell 306 (step 404). Microcontroller 204 then activates cell discharge circuit 202 of the first odd numbered cell 306 (step 406) by closing switch 302 of cell discharge circuit 202. Microcontroller 204 then reads a second voltage for this cell 306 (step 408) and determines if the difference or change between the voltage measurements is equal to or about equal to zero volts (step 410). In the case where a the difference in voltage is zero, the microcontroller 204 provides a signal to cell supervisory controller 104 indicating the zero voltage difference for one of the odd numbered cells 306 of battery module 102 (step 412). After notifying cell supervisory controller 104 the difference in voltage is zero or in the case where the voltage at step 410 is not zero, microcontroller 204 determines if the cell 306 was the last odd cell 306 (step 414).

If this was not the last odd cell 306, switch 302 of discharge circuit 202 for the next odd numbered cell 306 is activated (step 416). After activating switch 302 of discharge circuit 202 for the next odd numbered cell 306, microcontroller 204 reads the cell voltage for the cell 306 (step 418). After reading the cell voltage, the method 400 returns to step 410 to determine if the cell voltage is zero and continues looping through this series of actions and/or logic until each of the odd numbered cells 306 have been measured.

After determining that the last odd numbered cell 306 has been measured at step 414, microcontroller 204 measures a first voltage of the first even numbered cell 306 (step 419). Microcontroller 204 then activates cell discharge circuit 202 of the first even numbered cell 306 (step 420). As before, cell discharge circuit 202 is activated by microcontroller 204, closing switch 302 of cell discharge circuit 202. Microcontroller 204 then reads a second voltage of the first even numbered cell 306 (step 422).

Microcontroller 204 determines if a difference or change of the voltage measurements is equal to or about equal to zero volts (step 424). In the case where the difference in voltage is zero, the microcontroller 204 provides a signal to cell supervisory controller 104 indicating the zero voltage reading one of the even numbered cells 306 of battery module 102 (step 426). After notifying cell supervisory controller 104 of the zero voltage or in the case where the difference in voltage is not zero, microcontroller 204 determines if the cell 306 is the last even numbered cell 306 (step 428). If the cell 306 is not the last even numbered cell 306, switch 302 of discharge circuit 202 for the next even numbered cell 306 is activated (step 430). After activating switch 302 of discharge circuit 202 for the next even numbered cell 306, microcontroller 204 measures the cell voltage for the even cell 306 (step 432). After measuring the cell voltage, microcontroller 204 determines if the difference in cell voltage is zero and continues looping through this series of actions and/or logic until each of the even numbered cells 306 has been measured. After measuring each even numbered cell 306, microcontroller 204 deactivates the auto-diagnosis system (step 434).

It is to be understood and appreciated that the computer-implemented methods, programs, and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA), microprocessor-based or programmable consumer electronics, and the like, each of which can be operatively coupled to one or more associated devices.

The illustrated aspects of the disclosure can also be practiced in distributed computing environments where certain tasks are performed by remote processing devices that are linked through a communications network. In a distributed computing environment, program modules can be located in both local and remote memory storage devices.

As utilized herein, terms "component," "system," and the like, can refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., card, stick, key drive, etc.). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the cell diagnostic system and method therefore as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A system for assessing the accuracy of an electrochemical cell voltage measurement, comprising:
 a cell discharge circuit electrically coupled to an electrochemical cell and configured to at least partially discharge the cell when the cell discharge circuit is activated;
 a cell measurement circuit electrically coupled to the at least one cell and to the cell discharge circuit, the cell measurement circuit configured to measure a voltage of the at least one cell before activation of the cell discharge circuit and after activation of the cell discharge circuit, wherein the cell measurement circuit compares the voltage before activation of the cell discharge circuit to the voltage after activation of the cell discharge circuit to detect if an error in the voltage measurement occurred.

2. The system of claim 1, wherein the cell measurement circuit is configured to detect an error if the voltage before activation of the cell discharge circuit is equal to the voltage after activation of the cell discharge circuit.

3. The system of claim 2, wherein the cell measurement circuit is configured to detect an error if a sense line to the at least one cell is broken.

4. The system of claim 1, wherein the cell measurement circuit is configured to send a signal to a battery management system if an error is detected.

5. The system of claim 1, wherein the cell discharge circuit is electrically coupled to the at least one cell in parallel.

6. The system of claim 5, wherein the cell measurement circuit is electrically coupled to the cell discharge circuit in parallel.

7. The system of claim 1, wherein the cell discharge circuit comprises a resistor configured for balancing the voltage of the at least one cell to match the voltage of other cells in a battery system and a transistor configured to act as a switch to activate the cell discharge circuit.

8. The system of claim 7, wherein the cell measurement circuit comprises a microcontroller.

9. The system of claim 8, wherein the microcontroller is electrically coupled to the transistor of the cell discharge circuit in order to activate the cell discharge circuit.

10. A method for assessing the accuracy of an electrochemical cell voltage measurement, comprising:
   measuring a first voltage of at least one electrochemical cell using a cell measurement circuit electrically coupled to the at least one cell;
   activating a cell discharge circuit electrically coupled to the at least one cell to at least partially discharge the at least one cell;
   measuring a second voltage of the at least one cell after activation of the cell discharge circuit; and
   comparing the first voltage to the second voltage to determine if there is an error in the voltage measurement of the at least one cell.

11. The method of claim 10, wherein the cell measurement circuit is configured to detect an error if the first voltage is equal to the second voltage.

12. The method of claim 11, wherein the cell measurement circuit is configured to detect an error if a sense line to the at least one cell is broken.

13. The method of claim 10, wherein the cell measurement circuit is configured to send a signal to a battery management system if an error is detected.

14. The method of claim 10, wherein the cell discharge circuit is electrically coupled to the at least one cell in parallel.

15. The method of claim 14, wherein the cell measurement circuit is electrically coupled to the cell discharge circuit in parallel.

16. The method of claim 10, wherein the cell discharge circuit comprises a resistor configured for balancing the voltage of the at least one cell to match the voltage of other cells in a battery system.

17. The method of claim 16, wherein the cell discharge circuit further comprises a transistor configured to act as a switch in order to activate the cell discharge circuit.

18. The method of claim 10, wherein the cell measurement circuit comprises a microcontroller.

19. The method of claim 18, wherein the microcontroller is electrically coupled to the transistor of the cell discharge circuit in order to activate the cell discharge circuit.

20. A method for assessing the accuracy of an electrochemical cell voltage measurement, comprising:
   providing a cell measurement circuit electrically coupled to at least one cell;
   providing a cell discharge circuit electrically coupled to the at least one cell and configured to partially discharge the at least one cell when activated;
   measuring a first voltage of the at least one cell using the cell measurement circuit;
   activating the cell discharge circuit to partially discharge the at least one cell;
   measuring a second voltage of the at least one cell after activation of the cell discharge circuit;
   comparing the first voltage to the second voltage to determine if there is an error in the voltage measurement of the at least one cell.

* * * * *

UNITED STATES PATENT AND TRADEMARK OFFICE
CERTIFICATE OF CORRECTION

| | | |
|---|---|---|
| PATENT NO. | : 8,788,225 B2 | Page 1 of 1 |
| APPLICATION NO. | : 12/999587 | |
| DATED | : July 22, 2014 | |
| INVENTOR(S) | : Steven J. Wood et al. | |

It is certified that error appears in the above-identified patent and that said Letters Patent is hereby corrected as shown below:

IN THE CLAIMS

In Column 10, Line 57, in Claim 1, delete "coupled to an" and insert -- coupled to at least one --, therefor.

In Column 10, Lines 58-59, in Claim 1, delete "discharge the" and insert -- discharge the at least one --, therefor.

Signed and Sealed this
Seventeenth Day of February, 2015

Michelle K. Lee
*Deputy Director of the United States Patent and Trademark Office*